(12) United States Patent
Wurzer et al.

(10) Patent No.: US 6,451,676 B2
(45) Date of Patent: Sep. 17, 2002

(54) METHOD FOR SETTING THE THRESHOLD VOLTAGE OF A MOS TRANSISTOR

(75) Inventors: Helmut Wurzer; Guiseppe Curello, both of Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/811,799

(22) Filed: Mar. 19, 2001

(30) Foreign Application Priority Data

Mar. 17, 2000 (DE) .......................................... 100 14 916

(51) Int. Cl.$^7$ ............................................. H01L 21/425
(52) U.S. Cl. ........................................ 438/528; 438/257
(58) Field of Search ................................ 438/158, 163, 438/174, 194, 217, 289, 302, 528, 585, 60, 257, 301, 514, 527

(56) References Cited

U.S. PATENT DOCUMENTS

| | | | |
|---|---|---|---|
| 5,374,566 A | * 12/1994 | Iranmanesh | 438/202 |
| 5,426,069 A | 6/1995 | Selvakumar et al. | 438/60 |
| 5,633,177 A | 5/1997 | Anjum | 438/301 |
| 5,635,752 A | * 6/1997 | Kawasaki | 257/617 |
| 5,675,176 A | * 10/1997 | Ushiku et al. | 257/617 |
| 5,879,996 A | * 3/1999 | Forbes | 438/289 |
| 5,888,867 A | 3/1999 | Wang et al. | 438/257 |
| 6,114,206 A | 9/2000 | Yu | 438/270 |
| 6,180,499 B1 | * 1/2001 | Yu | 438/585 |
| 6,208,004 B1 | * 3/2001 | Cunningham | 247/413 |

FOREIGN PATENT DOCUMENTS

EP 0 707 346 A1 4/1996

OTHER PUBLICATIONS

King, Tsu–Jae et al.: "A Variable–Work–Function Polycrystalline–$Si_{1-x}Ge_x$ Gate Material for Submicrometer CMOS Technologies", IEEE Electron Device Letters, vol. 12, Oct. 1991, No. 10, pp. 533–535, XP 000226014.

Li, Vivian Z–Q et al.: "Single Gate 0.15 $\mu$m CMOS Devices Fabricated Using RTCVD In–Situ Boron Doped $Si_{1-x}Ge_x$ Gates", IEDM 97, pp. 833–836, XP–000855922.

Yu, Bin et al.: "Gate Engineering for Deep–Submicron CMOS Transistors", IEEE Transactions on Electron Devices, vol. 45, No. 6, Jun. 1998, pp. 1253–1261, XP–000754177.

* cited by examiner

*Primary Examiner*—David Nelms
*Assistant Examiner*—Phuc T. Dang
(74) *Attorney, Agent, or Firm*—Laurence A. Greenberg; Werner H. Stemer; Ralph E. Locher

(57) ABSTRACT

A method for setting the threshold voltage of a MOS transistor having a gate composed of polysilicon includes the step of implanting germanium ions into the gate composed of polysilicon in order to change the work function of the gate.

13 Claims, 2 Drawing Sheets

METHOD FOR SETTING THE THRESHOLD VOLTAGE OF A MOS TRANSISTOR

BACKGROUND OF THE INVENTION

Field of the Invention

The invention relates to a method for setting the threshold voltage in a MOS transistor, in particular during the fabrication of CMOS circuits.

A MOS (Metal Oxide Semiconductor) transistor is a field-effect transistor having an insulated control electrode or gate for controlling a current channel in a substrate. In this case, the charge carrier density in the semiconductor substrate is controlled by the voltage present at the gate terminal. If a sufficiently high voltage, which exceeds a specific threshold voltage, is applied to the gate electrode, an inversion current channel is produced at the semiconductor surface between the drain terminal and the source terminal of the MOSFET (Metal Oxide Semiconductor Field Effect Transistor), and a current can flow through the inversion current channel. The gate voltage, which is necessary to just form the inversion current channel, is referred to as the threshold voltage $U_T$ of the MOSFET. In CMOS (Complimentary Metal Oxide Semiconductor) technology, n-channel and p-channel MOS field-effect transistors are integrated simultaneously in the semiconductor substrate. In a conventional CMOS fabrication method, an n-type well, for example, is diffused into a p-conducting semiconductor substrate and a selective field oxidation is subsequently carried out in order to insulate the surfaces of the individual transistor regions from one another. A thin oxide layer is thereupon formed, which acts as a screen oxide or scatter oxide. The threshold voltages of the PMOS transistors and of the NMOS transistors are then set through the use of ion implantation. In a further process step, firstly the screen oxide is removed, then the gate oxide is produced and then polycrystalline silicon layers for the gate terminals are applied, and patterned, and, after electrical insulation of the gate stack from the drain and source regions through the use of a spacer, the diffusion of acceptors for the drain terminal and the source terminal of the PMOS transistor and a diffusion of donors for the drain terminal and source terminal of the NMOS transistor are carried out. After the contact windows have been opened by etching the drain and source regions, contacts can be made.

The coordination of the threshold voltage $U_T$ of the PMOS transistor and of the NMOS transistor complementary thereto in the CMOS circuit is of particular importance here since the threshold voltage of the two complementary transistors should be identical. The threshold voltage depends on the work function at the gate terminals. Work function refers to the energy required to release an electron from a crystal lattice. The gate electrodes are conventionally formed from crystalline polysilicon. The work function and thus the threshold voltage $U_T$ of the MOSFETs are in this case set by doping the polycrystalline silicon. By n-doping the gate electrode of the NMOS transistor and by p-doping the gate electrode of the PMOS transistor, the threshold voltages $U_T$ of the two complementary MOSFETs can be made the same in the conventional fabrication method. In this case, the threshold voltage $U_T$ typically lies between 0.5 volt and 0.7 volt.

The previous methods for setting the threshold voltages in NMOS transistors in CMOS fabrication technology have the disadvantage, however, that, on account of the different doping of the gate of the NMOS transistor and of the PMOS transistor, different dopants have to be provided and, furthermore, additional cost-intensive method steps for the masking and implantation of the different gate dopings are necessary.

A simpler and more cost-effective variant is to dope the polysilicon for both transistor types at an earlier point, for example when performing the deposition. A disadvantage is that the functionality of the "buried channel PMOS" is then reduced.

SUMMARY OF THE INVENTION

It is accordingly an object of the invention to provide a simple method for setting the threshold voltage in MOS transistors which overcomes the above-mentioned disadvantages of the heretofore-known methods of this general type and which allows to accurately set the threshold voltage through the use of a very small number of process steps.

With the foregoing and other objects in view there is provided, in accordance with the invention, a method for setting a threshold voltage of a MOS transistor, the method includes the steps of:

providing a gate for a MOS transistor, the gate being formed of polysilicon; and implanting germanium ions into the gate for changing a work function of the gate.

In other words, the invention provides a method for setting the threshold voltage in a MOS transistor having a gate composed of polysilicon, wherein germanium ions are implanted into the gate in order to change the work function of the gate composed of polysilicon.

Preferably, the gate implanted with germanium ions is subsequently heat-treated for annealing purposes or subjected to a thermal treatment by being exposed to a high temperature for a predetermined period of time.

This has the particular advantage that a crystalline gate structure is achieved.

In a particularly preferred mode of the invention, nitrogen ions are implanted into the gate composed of polysilicon before germanium ions are implanted.

This has the particular advantage that a thin layer composed of a silicon-nitrogen compound is formed between the gate and an underlying gate oxide, and prevents the formation of a germanium oxide layer.

Preferably, after the implantation of the nitrogen ions, the gate composed of polysilicon is heat-treated or subjected to thermal treatment for annealing purposes by being exposed to a high temperature for a specific period of time.

The method is preferably used for setting the threshold voltage of a PMOS transistor or an NMOS transistor in a CMOS circuit.

The temperature for thermal treatment of the gate after implantation is preferably above 1000° C.

The proportion of germanium which is implanted into the gate composed of polysilicon is preferably about 20%.

Other features which are considered as characteristic for the invention are set forth in the appended claims.

Although the invention is illustrated and described herein as embodied in a method for setting the threshold voltage in MOS transistors, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
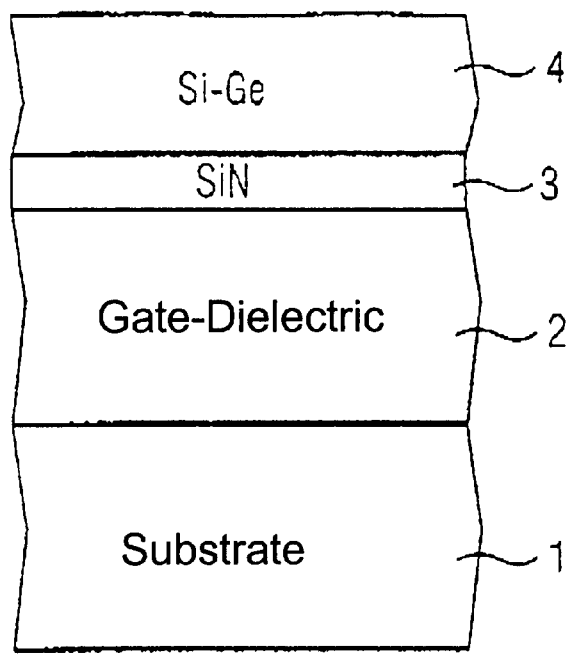
FIG. 1 is a diagrammatic, partial sectional view of the layer structure in a MOS transistor whose threshold voltage is set by the method according to the invention.
Figure 2:
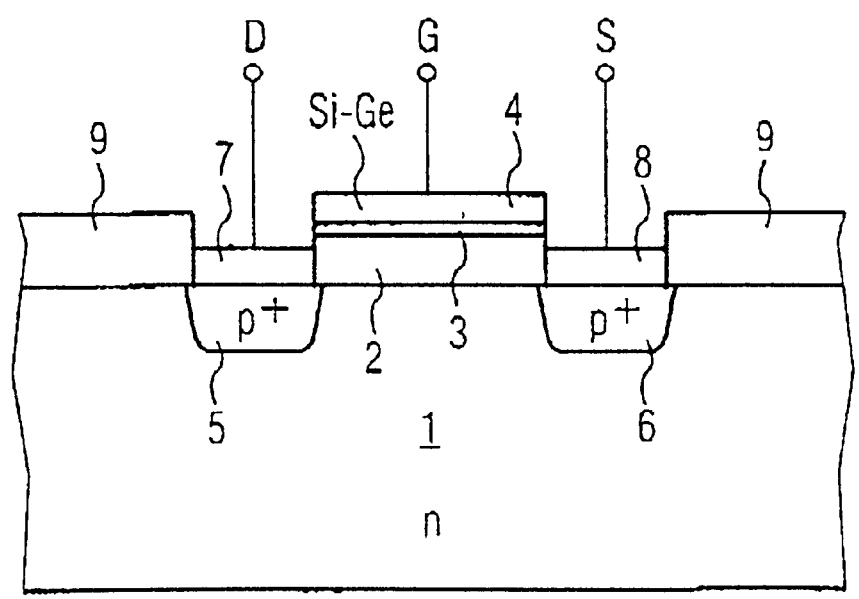
FIG. 2 is a diagrammatic, partial sectional view of a p-channel MOS field-effect transistor whose threshold voltage is set by the method according to the invention.

Referring now to the figures of the drawings in detail and first, particularly, to FIG. 2 thereof, there is shown that firstly a gate dielectric 2 is applied on a semiconductor substrate 1 by thermal oxidation of the substrate 1 or by a deposition method. In this case, the dielectric 2 is preferably composed of an oxide having a relatively high dielectric constant. As an alternative, the gate dielectric 2 may also be fabricated from silicon nitride. Polycrystalline silicon is subsequently applied on the gate dielectric 2 in order to form a gate control electrode. Nitrogen ions are implanted into this polysilicon layer by ion implantation. The polysilicon implanted with nitrogen ions is subsequently heat-treated by being exposed to a high temperature of above 1000° C. for a predetermined period of time. As a result, an oxidation barrier layer 3 including silicon and nitrogen is produced at the interface between the polysilicon layer and the gate dielectric 2. Germanium ions are subsequently implanted into the remaining polysilicon layer situated above the oxidation barrier layer, in order to change the work function of the gate composed of polysilicon. The implantation of the germanium ions initially produces an amorphous silicon layer, which is converted into a polycrystalline silicon-germanium compound by subsequent heat treatment or annealing at above 1000° C. in a furnace. The germanium-doped polysilicon layer 4 forms the gate terminal of the MOS transistor, the threshold voltage $U_T$, at which an inversion layer forms in the substrate 1, being set by the percentage proportion of germanium in the polysilicon.

FIG. 2 shows a PMOS transistor having a gate terminal G, a source terminal S, and a drain terminal D and whose threshold voltage $U_T$ is set by the implantation of germanium ions in the gate. The PMOS transistor has an n-doped semiconductor substrate 1, with a p$^+$-doped drain region 5 and a p$^+$-doped source region 6. Electrical contact is made with the drain region 5 and the source region 6 respectively via terminals 7, 8 composed of polysilicon. Moreover, the semiconductor substrate 1 is covered with field oxide 9.

The method according to the invention for setting the threshold voltage of a MOS transistor is suitable in particular for setting the threshold voltage $U_T$ of MOS transistors in a CMOS fabrication method.

Figure 3:
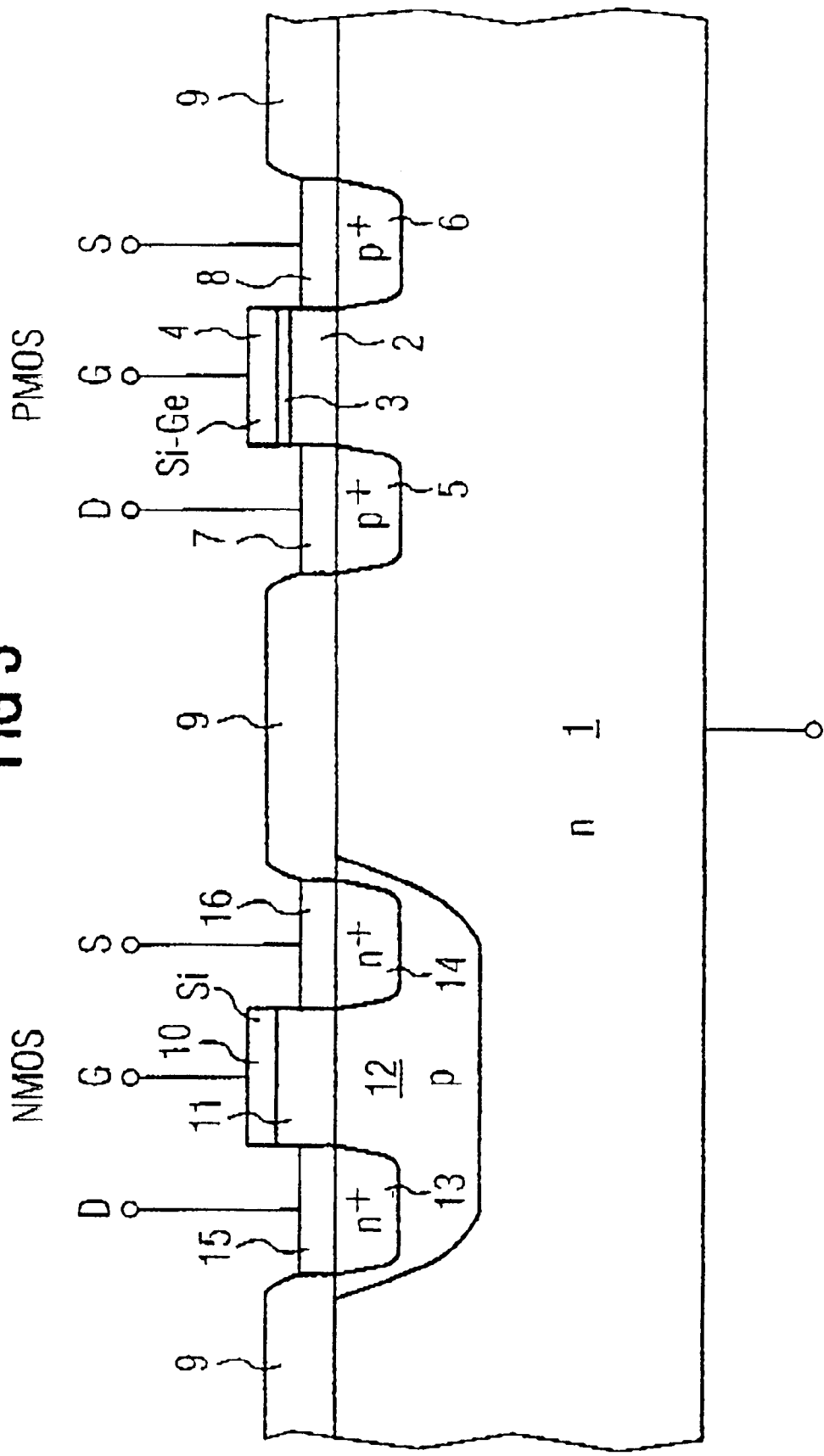
FIG. 3 is a diagrammatic, partial sectional view of a CMOS structure in which the threshold voltage of the PMOS transistor is set by the method according to the invention.

FIG. 3 shows a CMOS circuit having a PMOS transistor and an NMOS transistor complementary thereto. The NMOS transistor has a gate 10 which is composed of polysilicon and is isolated from a p-doped well region 12 by a dielectric 11. The p-doped well 12 is situated in the n-doped semiconductor substrate 1. The NMOS transistor has an n$^+$-doped drain region 13 and an n$^+$-doped source region 14. Electrical contact can be made with the drain region 13 and the source region 14 respectively via polysilicon terminals 15, 16.

By local implantation of germanium ions in the gate 3 of the PMOS transistor of the CMOS circuit illustrated in FIG. 3, the threshold voltage $U_{TP}$ of the PMOS transistor can be made the same as the threshold voltage $U_{TN}$ of the NMOS transistor. The higher the concentration of the implanted germanium, the more is the threshold voltage $U_{TP}$ for forming the inversion current channel in the PMOS transistor reduced. The threshold voltage $U_{TN}$ of the NMOS transistor is achieved, as in the conventional fabrication methods, by n$^+$-doping of the gate 10 composed of polysilicon. The implantation of germanium ions into the polysilicon layer is effected only in the region of the PMOS transistor and not in the region of the NMOS transistor. This is achieved using a resist mask or hard mask which locally covers the polysilicon layer for forming the gate terminals in the region of the NMOS transistor during the implantation of germanium ions. In this case, the masking prevents germanium ions from penetrating into the gate region 10—composed of polysilicon—of the subsequent NMOS transistor. A p$^+$-doping of the gate terminal in the PMOS transistor for the purpose of matching the threshold voltage $U_{TP}$ to the threshold voltage $U_{TN}$ of the NMOS transistor need not be effected since the threshold voltage $U_{TP}$ of the PMOS transistor is effected by the implantation of germanium ions. As a result, the fabrication of the CMOS circuit is simplified overall.

A high concentration of germanium ions in the SiGe gate 4 at the interface with the underlying dielectric 2 leads to a major influence on the work function and thus to a major change in the threshold voltage. The doping concentration of the germanium ions and thus the threshold voltage $U_T$ can be set very accurately through the use of the ion implantation. Moreover, concentration profiles can be controlled to the greatest possible extent according to form and position by varying the energy and direction of incidence of the implanted germanium ions. At the same time, the process temperatures can be kept low enough to preclude indiffusion of damaging contaminants. The structural changes caused by the ion implantation in the semiconductor crystal can be compensated by subsequent annealing by thermal treatment.

The method according to the invention improves the short-channel properties of the PMOS transistor without having to change the fabrication method for the NMOS transistor. In this case, the gate 10—composed of polysilicon—of the NMOS transistor and the silicon gate 4—implanted with germanium ions—of the PMOS transistor are fabricated in a deposition and etching process, as a result of which the fabrication process of a CMOS structure is considerably simplified.

A two-stage polysilicon deposition with germanium implantation with subsequent annealing can be carried out after each deposition. In this case, the implantation with germanium ions after the second deposition simultaneously destroys the silicon oxide which has formed between the deposition processes. A two-stage polysilicon deposition with implantation of germanium ions and subsequent annealing leads to an improvement of germanium depletion effects at the gate/gate oxide interface. The implantation of nitrogen ions for forming an oxidation barrier layer prevents the formation of a germanium oxide layer on the gate oxide surface. This can also be achieved by implanting halogen ions.

We claim:

1. A method for setting a threshold voltage of a MOS transistor, the method which comprises:

providing a gate for the MOS transistor, the gate being formed of polysilicon;

implanting nitrogen ions into the gate for forming an oxidation barrier layer; and implanting germanium ions into the gate for changing a work function of the gate, after the step of implanting nitrogen ions.

2. The method according to claim 1, which comprises thermally treating the gate for annealing purposes by exposing the gate to a given temperature for a given period of time, subsequent to the step of implanting the nitrogen ions.

3. The method according to claim 1, which comprises:

providing, as the MOS transistor, a PMOS transistor in a CMOS circuit; and setting a threshold voltage of the PMOS transistor with the implanting step.

4. The method according to claim 1, which comprises:

providing, as the MOS transistor, an NMOS transistor in a CMOS circuit; and setting a threshold voltage of the NMOS transistor with the implanting step.

5. The method according to claim 1, which comprises thermally treating the gate for annealing purposes by exposing the gate to a temperature higher than 1000° C.

6. The method according to claim 1, which comprises providing, with the implanting step, a germanium proportion of substantially 20% in the polysilicon of the gate.

7. A method for setting a threshold voltage of a MOS transistor, the method which comprises:

implanting nitrogen ions into a gate of the MOS transistor for forming an oxidation barrier layer;

implanting germanium ions into the gate of the MOS transistor, after the step of implanting nitrogen ions; and subsequently annealing the gate with a thermal treatment by exposing the gate to a given temperature for a given period of time.

8. The method according to claim 7, which comprises thermally treating the gate for annealing purposes by exposing the gate to a given temperature for a given period of time, subsequent to the step of implanting the nitrogen ions.

9. The method according to claim 7, which comprises:

providing, as the MOS transistor, a PMOS transistor in a CMOS circuit; and setting a threshold voltage of the PMOS transistor with the implanting step.

10. The method according to claim 7, which comprises:

providing, as the MOS transistor, an NMOS transistor in a CMOS circuit; and setting a threshold voltage of the NMOS transistor with the implanting step.

11. The method according to claim 7, which comprises thermally treating the gate for annealing purposes by exposing the gate to a temperature higher than 1000° C.

12. The method according to claim 7, which comprises providing, with the implanting step, a germanium proportion of substantially 20% in the polysilicon of the gate.

13. A method for setting a threshold voltage of a MOS transistor, the method which comprises:

providing a gate formed of polysilicon for the MOS transistor;

implanting nitrogen ions into the gate for forming an oxidation barrier layer; and setting a threshold voltage of the MOS transistor by implanting germanium ions into the gate, after the step of implanting nitrogen ions.

* * * * *